United States Patent
Yang et al.

(10) Patent No.: US 10,937,741 B2
(45) Date of Patent: Mar. 2, 2021

(54) MOLDED LASER PACKAGE WITH ELECTROMAGNETIC INTERFERENCE SHIELD AND METHOD OF MAKING

(71) Applicant: STATS ChipPAC Pte. Ltd., Singapore (SG)

(72) Inventors: DeokKyung Yang, Incheon Si (KR); HunTeak Lee, Gyeongi-do (KR); HeeSoo Lee, Kyunggi-do (KR); Wanil Lee, Incheon-Si (KR); SangDuk Lee, Dublin, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 134 days.

(21) Appl. No.: 16/193,691

(22) Filed: Nov. 16, 2018

(65) Prior Publication Data
US 2020/0161252 A1   May 21, 2020

(51) Int. Cl.
*H01L 23/552* (2006.01)
*H01L 23/31* (2006.01)
*H01L 21/56* (2006.01)
*H01L 23/66* (2006.01)

(52) U.S. Cl.
CPC .......... *H01L 23/552* (2013.01); *H01L 21/568* (2013.01); *H01L 23/3107* (2013.01); *H01L 23/66* (2013.01); *H01L 2223/6677* (2013.01)

(58) Field of Classification Search
CPC . H01L 23/552; H01L 23/556; H01L 23/3107; H01L 21/568; H01L 23/66; H01L 2223/6677; H01L 2221/68345; H01L 2221/68359; H01L 21/6835; H01L 21/561; H01L 2924/19105; H01L 2224/97; H01L 2224/16225; H01L 2924/181
See application file for complete search history.

(56) References Cited

U.S. PATENT DOCUMENTS

| | | | |
|---|---|---|---|
| 6,770,955 B1 * | 8/2004 | Coccioli | H01L 23/3128 257/659 |
| 9,269,673 B1 * | 2/2016 | Lin | H01L 23/552 |
| 9,461,001 B1 * | 10/2016 | Tsai | H01L 23/552 |
| 9,520,387 B2 | 12/2016 | Kim et al. | |
| 9,691,711 B2 | 6/2017 | Mahajan et al. | |
| 9,899,341 B2 | 2/2018 | Hashemi et al. | |
| 2004/0124518 A1 * | 7/2004 | Karnezos | H01L 25/162 257/686 |
| 2013/0075923 A1 | 3/2013 | Park et al. | |
| 2018/0269181 A1 * | 9/2018 | Yang | H01L 21/6835 |
| 2020/0105715 A1 * | 4/2020 | Jang | H01L 23/552 |

* cited by examiner

*Primary Examiner* — John P. Dulka
(74) *Attorney, Agent, or Firm* — Brian M. Kaufman; Robert D. Atkins; Patent Law Group: Atkins and Associates, P.C.

(57) ABSTRACT

A semiconductor device has a substrate comprising a carrier and an interposer disposed on the carrier. An electrical component is disposed over a first surface of the interposer. An interconnect structure is disposed over the first surface of the interposer. An encapsulant is deposited over the electrical component, interconnect structure, and substrate. A trench is formed through the encapsulant and interposer into the carrier. A shielding layer is formed over the encapsulant and into the trench. The carrier is removed after forming the shielding layer.

25 Claims, 9 Drawing Sheets

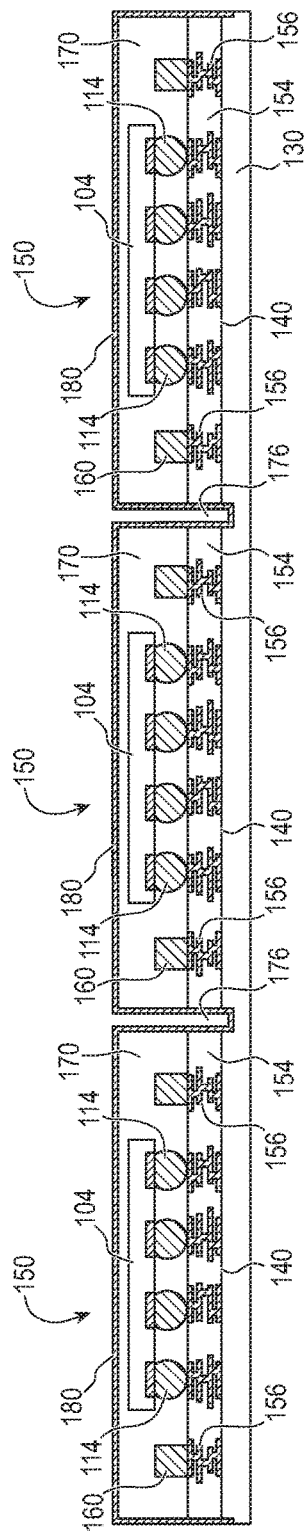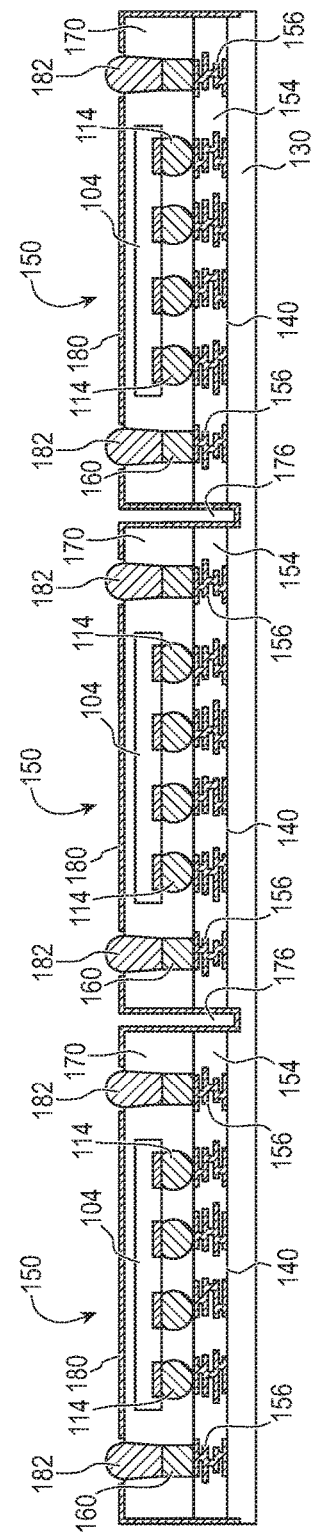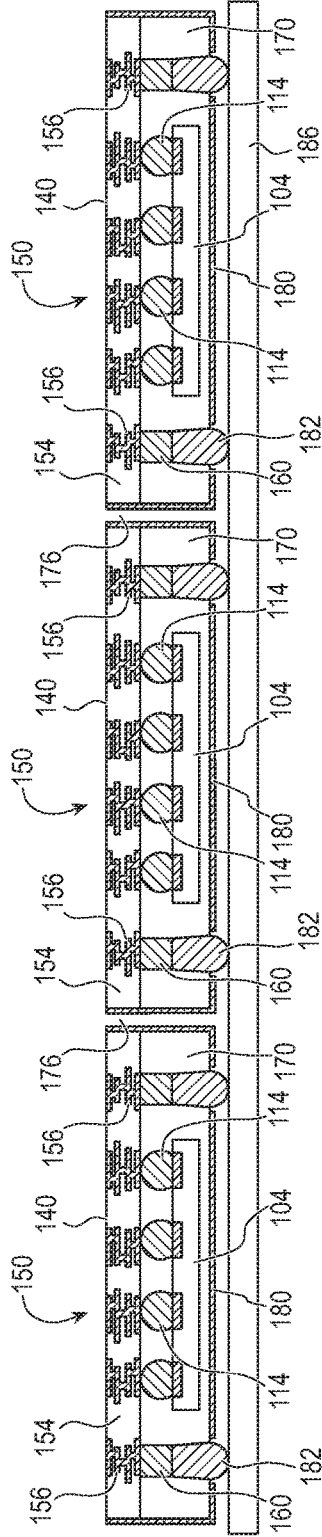

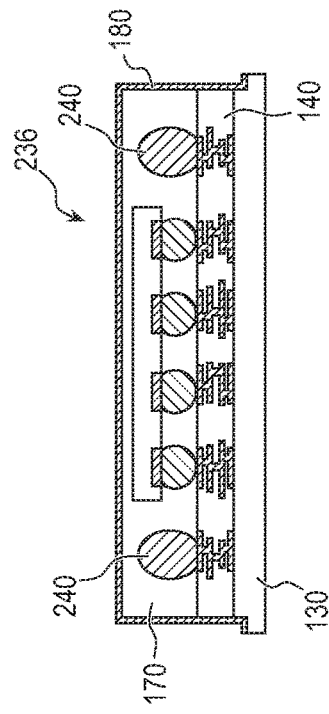
FIG. 4a
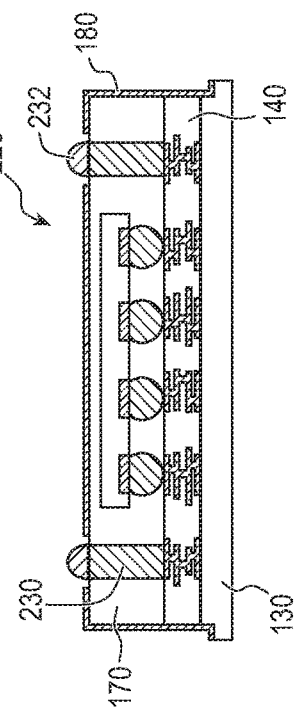
FIG. 4b
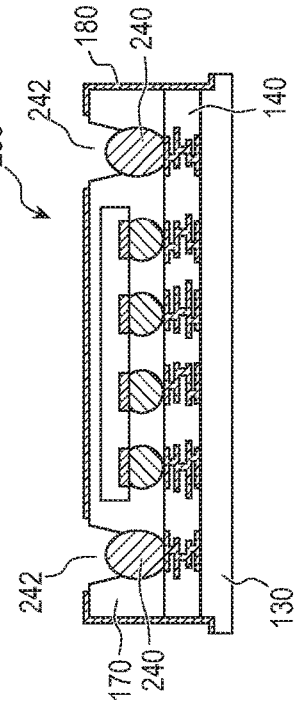
FIG. 5a
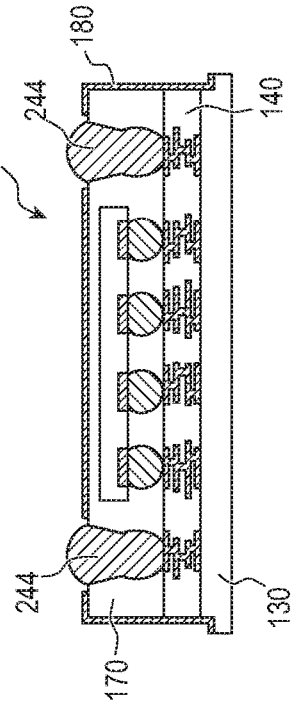
FIG. 5b
FIG. 5c

MOLDED LASER PACKAGE WITH ELECTROMAGNETIC INTERFERENCE SHIELD AND METHOD OF MAKING

FIELD OF THE INVENTION

The present invention relates in general to semiconductor devices and, more particularly, to molded laser semiconductor packages (MLP) with electromagnetic interference (EMI) shielding and methods of making.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Some shielding layers commonly are electrically coupled to ground through a package substrate to improve performance.

One problem with prior methods of semiconductor package shielding is that forming the shielding layer over a package adds significant cost and several steps to the manufacturing process. Therefore, a need exists for improvements to EMI shielding and manufacturing methods.

BRIEF DESCRIPTION OF THE DRAWINGS

FIGS. 2a-2f illustrate forming a molded laser package (MLP) with an electromagnetic interference (EMI) shielding layer;

FIGS. 4a and 4b illustrate using conductive pillars as a vertical interconnect structure in the MLP units;

FIGS. 5a-5c illustrate using solder bumps as the vertical interconnect structure in the MLP units;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
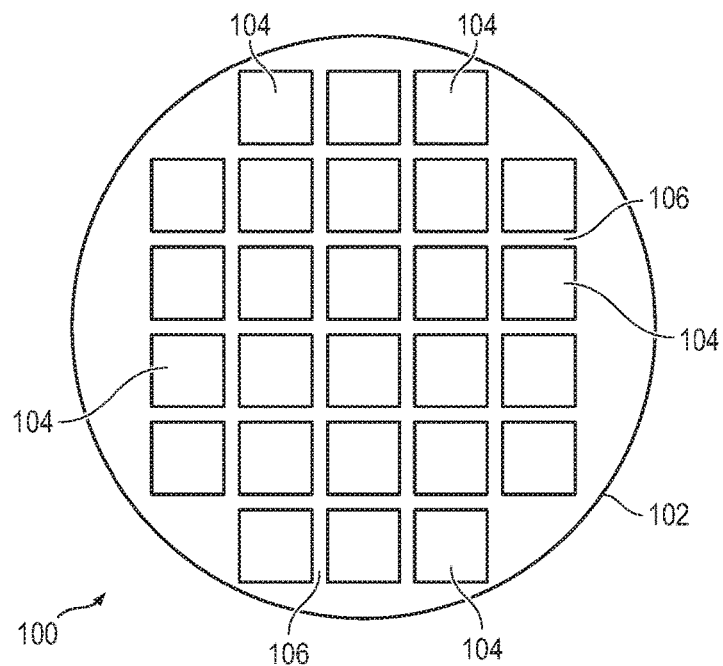
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
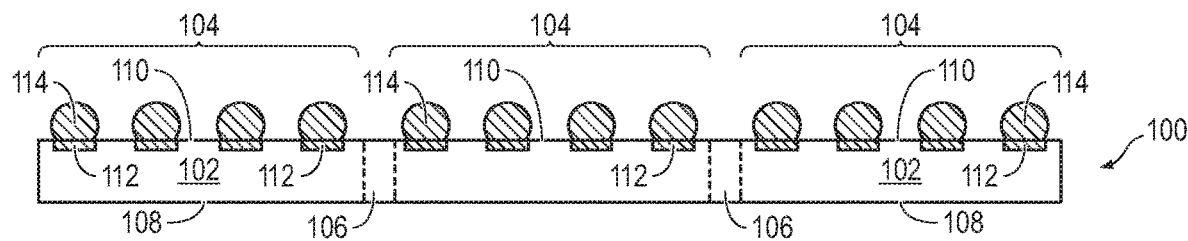

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
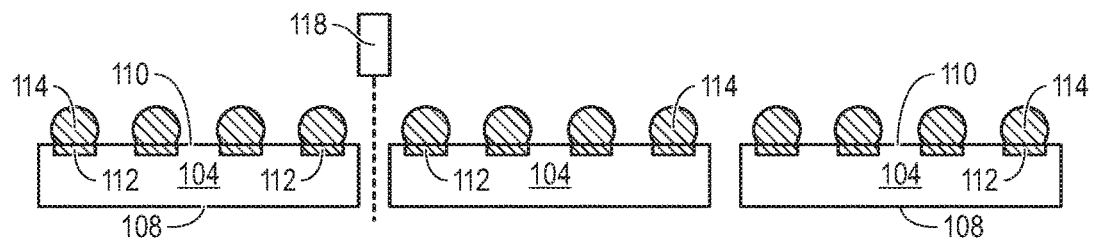

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) after singulation.

Figure 2A:
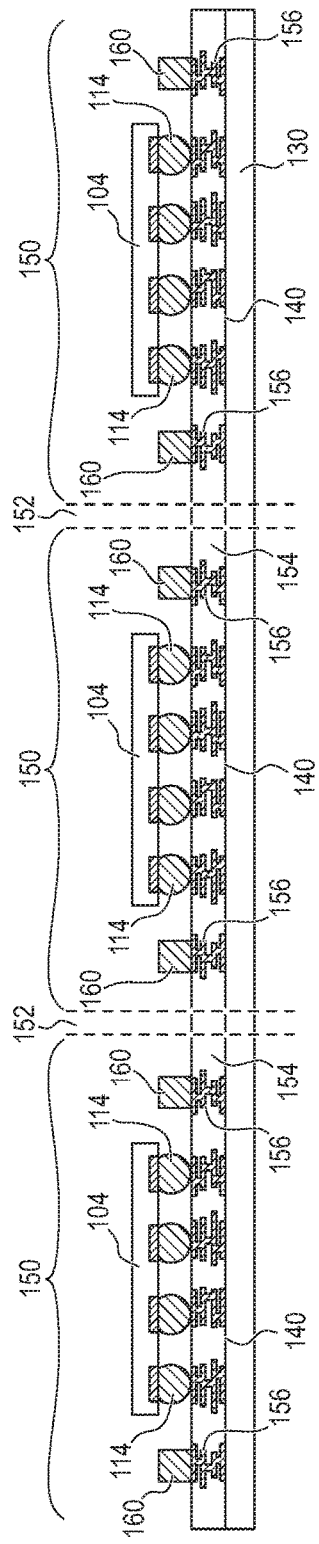

FIGS. 2a-2f illustrate a method of packaging semiconductor die 104 in a molded laser package (MLP) having an electromagnetic interference (EMI) shielding layer. FIG. 2a shows a partial cross-sectional view of a carrier 130 having an interposer substrate 140 disposed thereon. Carrier 130 is a flat sheet of organic material, glass, silicon, polymer, or any other material suitable to provide physical support of interposer 140 during the manufacturing process. In one embodiment, carrier 130 has a thickness of around 500 micrometers (μm). An optional double-sided tape, thermal release layer, UV release layer, or other appropriate interface layer can be disposed between carrier 130 and interposer 140. In some embodiments, carrier 130 and interposer 140 are provided together as a carrier ultra-thin substrate (CUTS). A CUTS PCB is a thin PCB using a carrier for handling. The carrier thickness is around 400 μm in some embodiments. The illustrated portion of interposer 140 includes room for forming three MLP units 150 separated by saw streets 152. The entirety of interposer 140 will commonly include room for forming hundreds, thousands, or even more MLP units in parallel.

Interposer 140 is formed from a base insulating material 154 with conductive layers 156 formed over outer surfaces of the interposer and interleaved between layers of the insulating material. Conductive layers 156 include contact pads, conductive traces, and conductive vias configured as necessary to implement a desired signal routing. Portions of conductive layers 156 are electrically common or electrically isolated depending on the design and function of the MLP unit being formed. Conductive layers 156 can be one or more layers of Al, Cu, Sn, Ni, Au, Ag, or other suitable electrically conductive material. In some embodiments, passivation or solder resist layers are formed over the top and bottom surfaces of interposer 140 with openings to expose contact pads of conductive layer 156.

Interposer 140 can also be any suitable laminate interposer, PCB, wafer-form, strip interposer, leadframe, or other type of substrate. Interposer 140 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating material 154 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Interposer 140 can also be a multi-layer flexible laminate, ceramic, copper clad laminate, glass, or semiconductor wafer including an active surface containing one or more transistors, diodes, and other circuit elements to implement analog or digital circuits.

Semiconductor die 104 are flip-chip mounted onto interposer 140, generally using a pick and place process, and electrically connected to conductive layer 156 by conductive bumps 114. In other embodiments, additional components are mounted onto interposer 140 along with or instead of semiconductor die 104 to form a system-in-package (SiP) module. The components mounted onto interposer 140 can include semiconductor die, semiconductor packages, discrete active or passive components, or any other suitable electrical component.

Conductive pillars 160 are formed on contact pads of conductive layer 156. Conductive pillars 160 are formed by depositing one or more layers of Al, Cu, Sn, Ni, Au, Ag, or other suitable conductive material into openings of a masking layer. In other embodiments, conductive pillars 160 are formed by another suitable metal deposition technique.

Figure 2B:
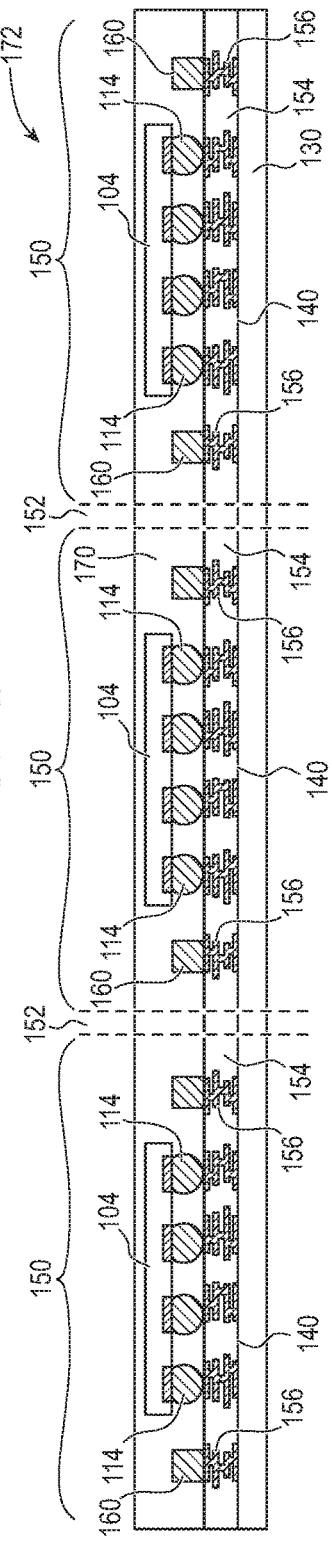
Figure 2C:
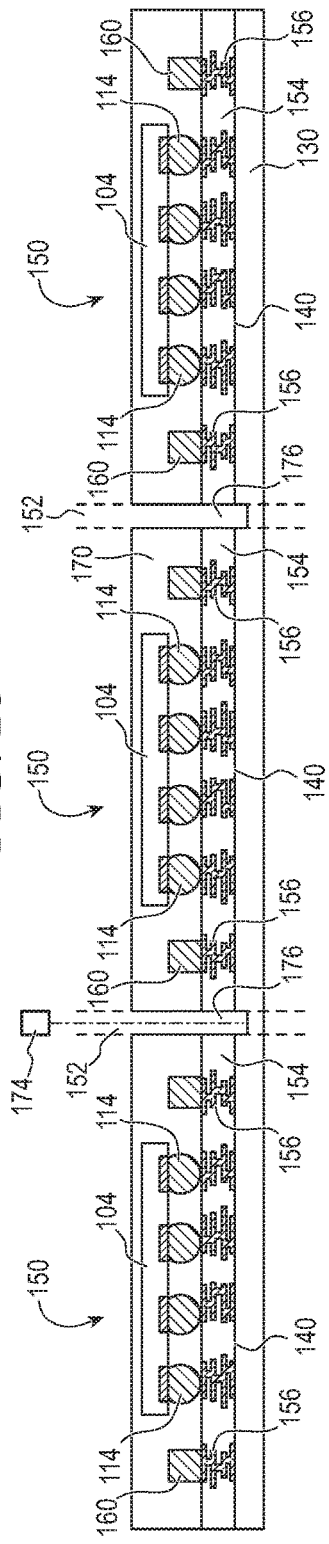

In FIG. 2b, an encapsulant or molding compound 170 is deposited over interposer 140, semiconductor die 104, and conductive pillars 160 using a paste printing, compressive molding, transfer molding, liquid encapsulant molding, vacuum lamination, spin coating, or another suitable applicator. Encapsulant 170 can be polymer composite material, such as epoxy resin, epoxy acrylate, or polymer with or without a filler. Encapsulant 170 is non-conductive, provides structural support, and environmentally protects the semiconductor device from external elements and contaminants.

Semiconductor die 104 embedded in encapsulant 170 forms a panel 172 of MLP units 150. Panel 172 is singulated in FIG. 2c using a saw blade, laser cutting tool, or other suitable cutting tool 174. Cutting tool 174 forms trenches 176 in saw streets 152 surrounding each MLP unit 150. Trenches 176 extend completely through encapsulant 170 and interposer 140, and into carrier 130. Following singulation in FIG. 2c, each MLP unit 150 includes exposed side surfaces of encapsulant 170 and interposer 140 within trenches 176 that completely surround the respective unit in plan view. Trenches 176 extend only partially through carrier 130 so that MLP units 150 remain attached to each other by the carrier. MLP units remain in substantially the same relative positions as in panel 172 prior to singulation.

In FIG. 2d, EMI shielding layer 180 is formed over MLP units 150 by plating conductive material over the top of the units and into trenches 176. Plating is performed by CVD, PVD, other sputtering methods, electroless plating, or other suitable metal deposition process. Depending on the specific deposition technique used, trenches 176 may be conformally coated as illustrated, or the trenches may be completely filled with conductive material. Shielding layer 180 includes one or more layers of Al, Cu, Sn, Ni, Au, Ag, or other suitable electrically conductive material. Shielding layer 180 totally covers top and side surfaces of encapsulant 170 and side surfaces of interposer 140. In some embodiments, portions of conductive layers 156 are exposed in trenches 176 to electrically couple shielding layer 180 to a ground reference node.

FIG. 2e shows conductive bumps 182 formed on conductive pillars 160. First, openings are formed through shielding layer 180 and encapsulant 170 to expose conductive pillars 160. The openings are commonly formed using laser drilling, thus the name of the package type being molded "laser" package. In one embodiment, an ultraviolet (UV) laser is used. One benefit of laser drilling is that instances of metal burrs after via cleaning are reduced. However, mechanical drilling, chemical etching, or any other suitable mechanism for exposing conductive pillars 160 is used in other embodiments. Bumps 182 are disposed within the openings using solder paste printing, a ball drop process, or any other suitable process. Bumps 182 can be reflowed to mechanically bond the bumps to conductive pillars 160. Other suitable interconnect structures are used in other embodiments, e.g., stud bumps or wire bonds. The openings through shielding layer 180 are each individually larger than respective openings through encapsulant 170 so that signals through bumps 182 are not short circuited to shielding layer 180. However, shielding layer 180 is left extending to bumps 182 in some cases, e.g., for ground node connections.

In FIG. 2f, MLP units 150 are transferred to carrier 186. Carrier 130 is used to keep MLP units 150 together as a panel, and then removed once the MLP units are on carrier 186. In some embodiments, a laser or other cutting tool is used to remove a portion of shielding layer 180 near the bottom of trenches 176 to physically separate MLP units 150 prior to flipping and removing carrier 130.

MLP units 150 in FIG. 2e or 2f are completed semiconductor packages that are ready to be picked and placed onto PCBs or into a tape and reel for shipment to customers. Shielding layer 180 protects semiconductor die 104 from EMI. Because only the bottom of MLP units 150 are covered in shielding layer 180, antennae or other RF circuits are exposed to signals received from above that may be used for operation of the unit. Semiconductor die 104 is electrically coupled to bumps 182 through conductive layers 156 and conductive pillars 160. Shielding layer 180 is formed in an easy, low cost process flow. Shielding layer 180 is formed immediately after encapsulation on interposer 140, without additional processing steps usually needed to add EMI shielding after the package is complete.

Figure 3A:
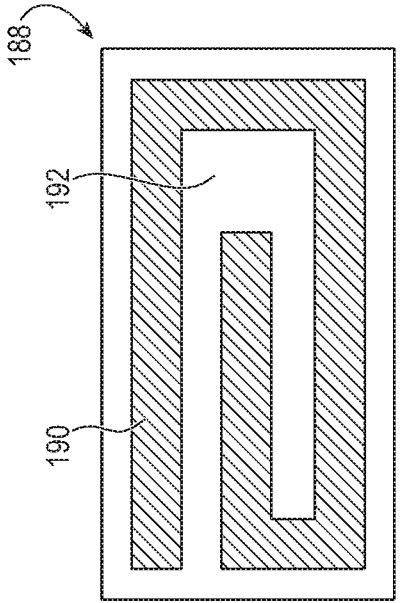
FIGS. 3a-3d illustrate options for components disposed over the MLP units.
Figure 3B:
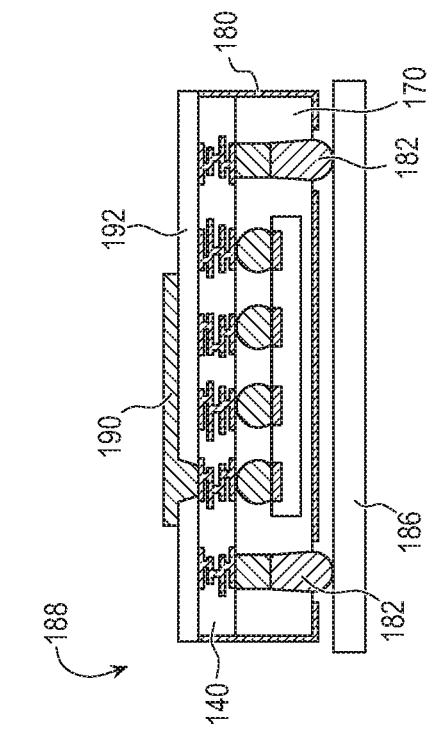

While MLP units 150 have single semiconductor die 104 as their only electrical component, the top surface of interposer 140 in FIG. 2f remains available for the subsequent formation or addition of other electrical components as desired. FIGS. 3a and 3b illustrate MLP unit 188 created by forming an antenna 190 on interposer 140 opposite semiconductor die 104. FIG. 3a is a cross-sectional view, while FIG. 3b shows a plan view of the same device. An optional insulating layer 192 is formed between antenna 190 and interposer 140 to electrically isolate the antenna from conductive layers 156. In other embodiments, conductive layers 156 are not exposed within the desired footprint of antenna 190, and insulating material 154 is sufficient to isolate the antenna. Antenna 190 is illustrated as a spiral, but any suitable antenna pattern is usable in other embodiments, e.g., loop, linear, patch, dipole, etc.

Figure 3C:
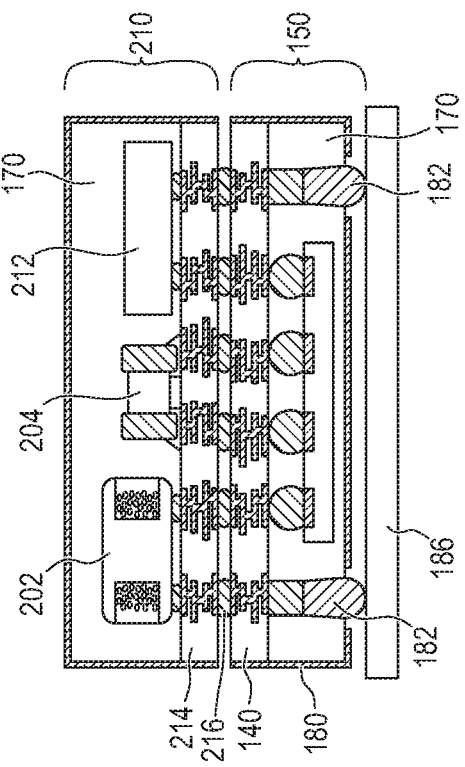

FIG. 3c shows MLP unit 200 with inductor 202, capacitor 204, and semiconductor package 206 mounted onto interposer 140 opposite semiconductor die 104. Semiconductor package 206 optionally includes a shielding layer formed in the same manner as shielding layer 180 to protect the packaged semiconductor die from EMI while still allowing other components on interposer 140 to send or receive electromagnetic signal broadcasts. Any combination of active or passive electrical components can be mounted onto interposer 140 together, including bare semiconductor die. In one embodiment, components 202-206 from FIG. 3c are mounted onto interposer 140 adjacent to antenna 190 from FIG. 3b.

Figure 3D:
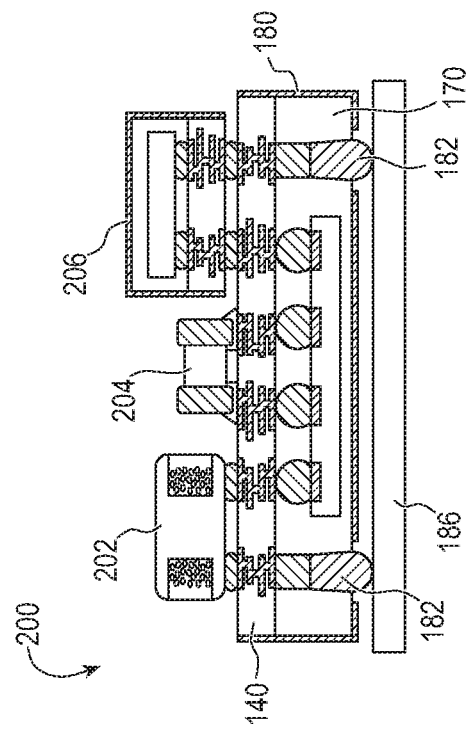

FIG. 3d illustrates a second MLP unit 210 mounted to MLP unit 150. MLP unit 210 includes inductor 202, capacitor 204, and semiconductor die 212 mounted onto an interposer 214. Interposer 214 is substantially the same as interposer 140, but includes different signal routing as necessary to couple the mounted components 202, 204, and 212 to contact pads of interposer 214 aligned with contact pads of interposer 140. Conductive bumps 216 are reflowed between interposer 140 and interposer 214 to mechanically and electrically couple MLP units 150 and 210 to each other. An additional adhesive, underfill, or encapsulation layer is disposed between MLP units 150 and 210 around bumps 216 in some embodiments.

MLP units 210 include encapsulant 170 and EMI shielding layer 180 formed in substantially the same process as with MLP units 150. However, rather than forming bumps 182 through encapsulant 170 for external interconnect, MLP 210 connects externally through interposer 214, bumps 216, interposer 140, and bumps 182 of MLP unit 150. MLP unit 150 can have the same footprint as MLP unit 210, or either MLP unit can be larger. MLP unit 210 can be mounted onto interposer 140 adjacent to other electrical components, including other packages, discrete components, or antenna 190.

FIGS. 4a and 4b illustrate forming MLP units 226 with an alternative conductive pillar configuration as the vertical interconnect structure through encapsulant 170. FIG. 4a shows conductive pillars 230 formed taller than a back surface of semiconductor die 104. Encapsulant 170 is applied with film-assisted molding or another method that leaves conductive pillars 230 exposed from the encapsulant. In other embodiments, encapsulant 170 is planarized after deposition to expose pillars 230. Shielding layer 180 is formed directly on conductive pillars 230.

In FIG. 4b, openings are formed through shielding layer 180 to expose top surfaces of conductive pillars 230. Shielding layer 180 can remain covering one or more conductive pillars 230 to maintain an electrical connection between those pillars and the shielding layer. In some embodiments, a first portion of shielding layer 180 is removed circumscribing each conductive pillar 230 to electrically isolate the conductive pillars from the shielding layer, while a second portion of the shielding layer remains on the conductive pillars as a contact pad. Bumps 232 are formed on or over conductive pillars 230 by solder paste printing or another suitable process. Pillars 230 and bumps 232 are usable in any of the above or below embodiments instead of conductive pillars 160 and bumps 182. Bumps 182 are reflowed to mount MLP unit 226 onto a PCB or substrate of a larger electronic device.

FIGS. 5a-5c show forming MLP units 236 with solder bumps 240 replacing conductive pillars 160. FIG. 5a illustrates MLP unit 236 in a similar state to MLP units 150 in FIG. 2d. However, solder bumps 240 are formed on interposer 140 rather than conductive pillars 160. In FIG. 5b, openings 242 are formed through encapsulant 170 and shielding layer 180 down to solder bumps 240. In FIG. 5c, additional solder is added into openings 242 to enlarge bumps 240 into bumps 244. Bumps 244 extend from conductive layer 156 to above the plane of the external surface of MLP unit 236 to allow mounting onto a PCB or substrate of a larger electronic device.

FIGS. 6a-6f illustrate forming double-sided shielding over an MLP unit. Continuing from FIG. 2b, panel 172 is flipped and disposed on carrier 250 in FIG. 6a. Panel 172 is disposed with semiconductor die 104 oriented toward carrier 250 and interposer 140 oriented away from the carrier. Inductor 202, capacitor 204, and semiconductor package 206 are mounted on interposer 140 opposite semiconductor die 104. The mounted components can be any suitable electrical component or combination of components. An encapsulant 252 is deposited over interposer 140 and components 202-206 in a similar manner to encapsulant 170. The combination of encapsulants 252 and 170 and the enclosed electrical components forms a panel 254. A shielding layer 256 is formed over encapsulant 252 opposite interposer 140. Shielding layer 256 is formed similarly to shielding layer 180 above.

Figure 6A:
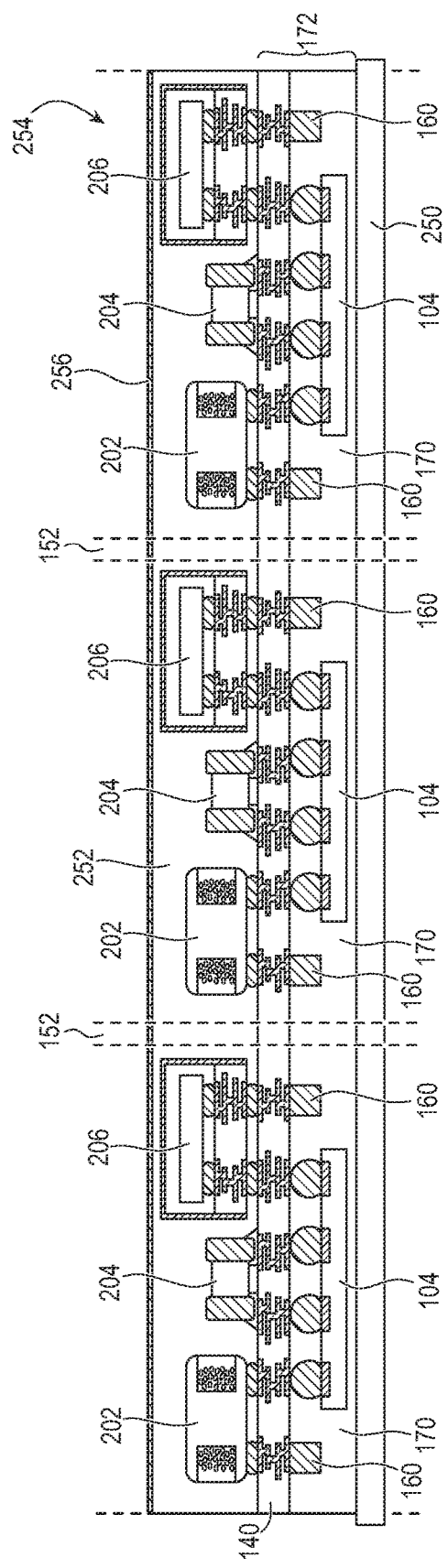
FIGS. 6a-6f illustrate forming MLP units with double sided shielding.
Figure 6B:
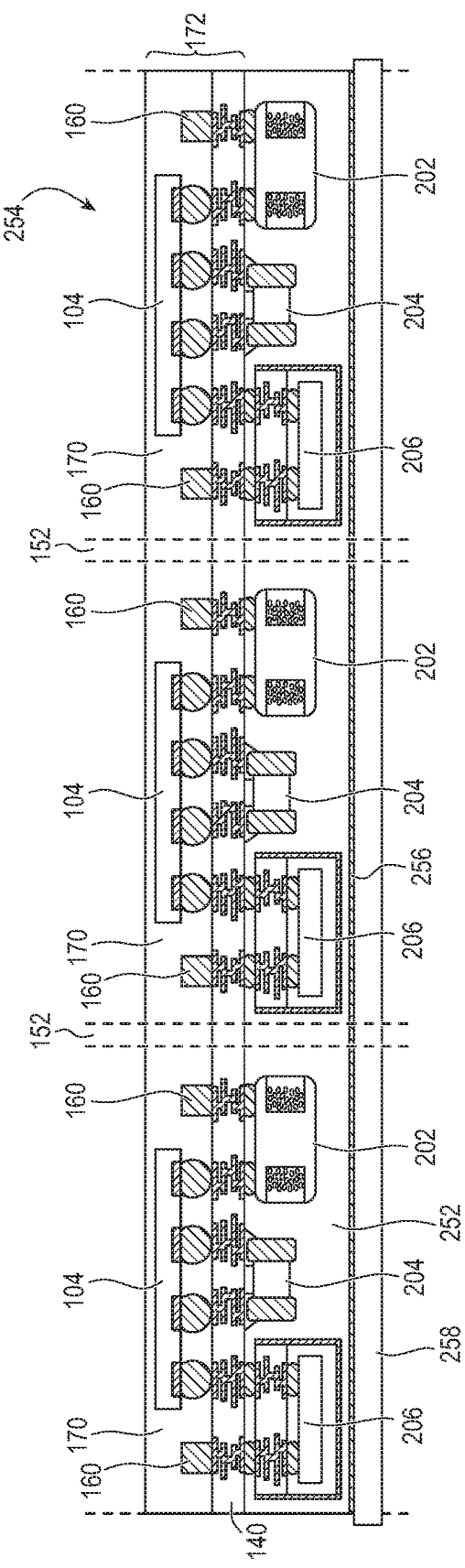
Figure 6C:
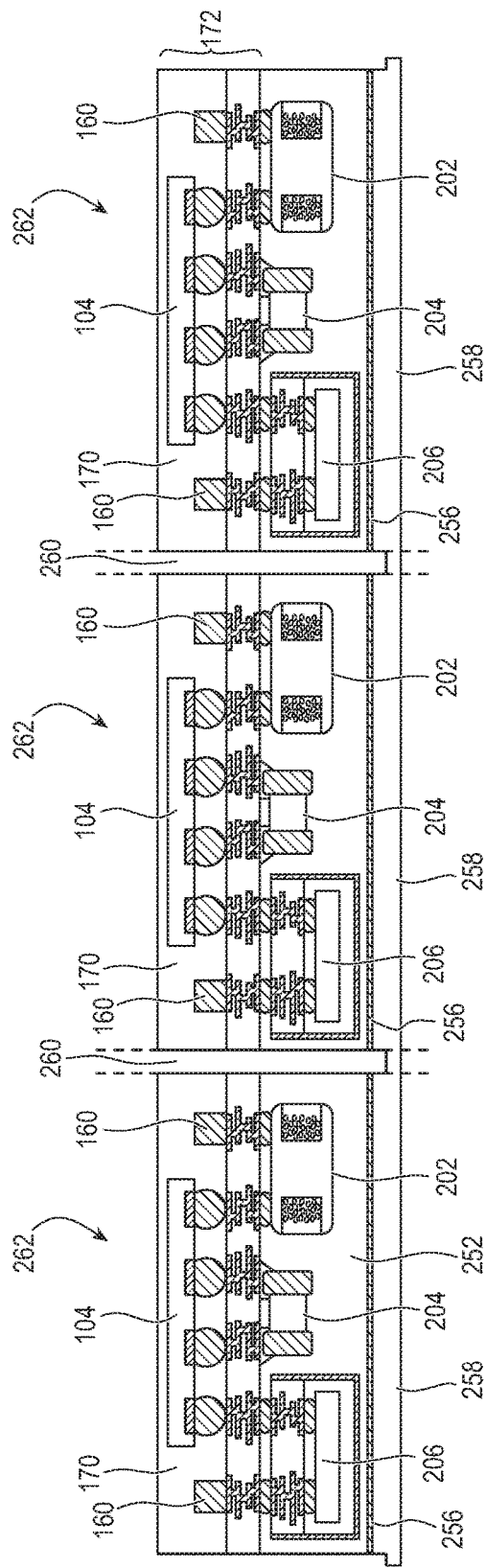

In FIG. 6b, panel 254 is flipped onto carrier 258 so that semiconductor die 104 are again oriented away from the carrier. With components 202, 204, and 206, encapsulant 252, and shielding layer 256 formed on the bottom of interposer 140, manufacturing continues with similar process steps as above. In FIG. 6c, trenches 260 are formed in saw streets 152 as in FIG. 2c. Trenches 260 extend through shielding layer 256 and into carrier 258. Trenches 260 singulate panel 254 into a plurality of MLP units 262.

Figure 6D:
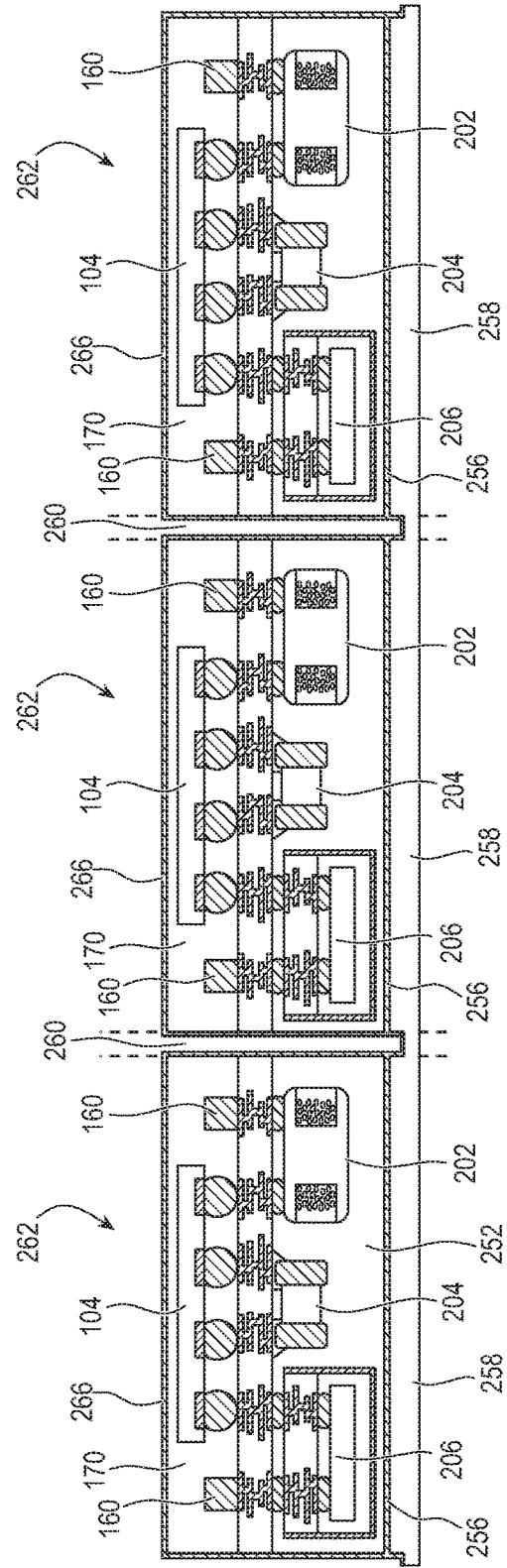
Figure 6E:
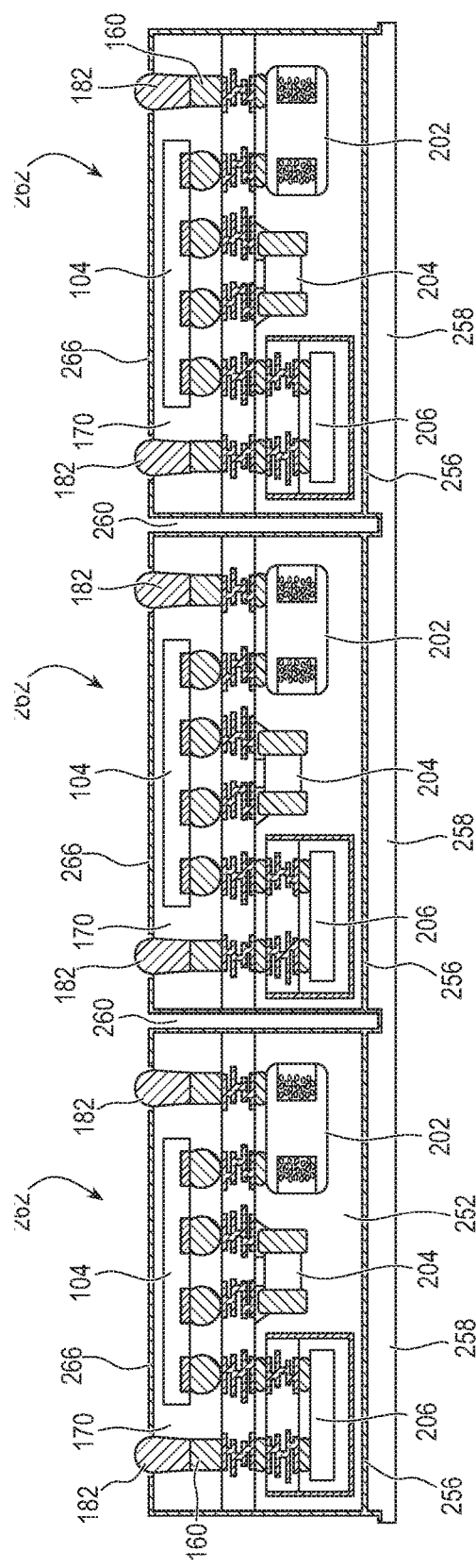

In FIG. 6d, a shielding layer 266 is formed over the top of MLP units 262 and into trenches 260 to cover side surfaces of the MLP units. Forming shielding layer 266 is similar to forming shielding layer 180 in FIG. 2d. Shielding layer 266 extends down into trenches 260 to contact shielding layer 256. The combination of shielding layers 256 and 266 covers substantially the entirety of all external surfaces of each MLP unit 262. In FIG. 6e, bumps 182 are formed on conductive pillars 160 in openings of encapsulant 170 and shielding layer 266, similar to FIG. 2e. MLP units 262 are removed from carrier 258 and can be picked and placed on a substrate or PCB of a larger electronic device, or packaged into a tape and reel for distribution.

Figure 6F:
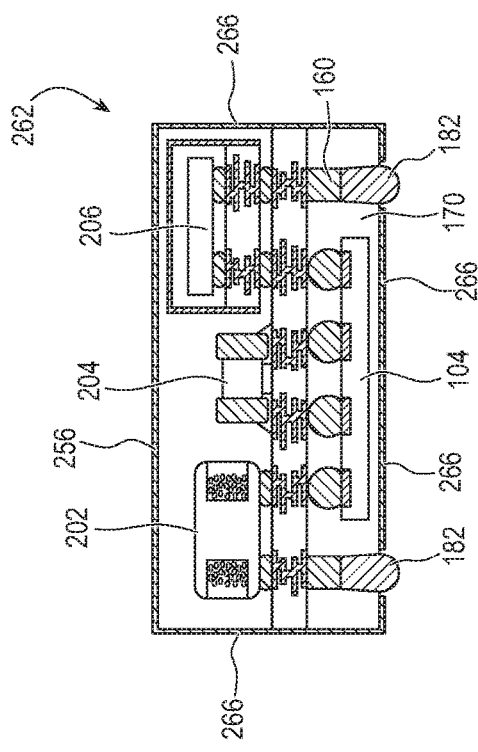

FIG. 6f illustrates a finished MLP unit 262. Interposer 140 routes electrical signals from inductor 202, capacitor 204, and package 206 to semiconductor die 104 and to external components through conductive pillars 160 and bumps 182. Shielding layer 256 protects the top of MLP unit 262 from EMI while shielding layer 266 protects the bottom and sides. MLP unit 262 is nearly entirely covered in EMI shielding layers, and formed in a process much simpler and cheaper than those used in the prior art.

Figure 7A:
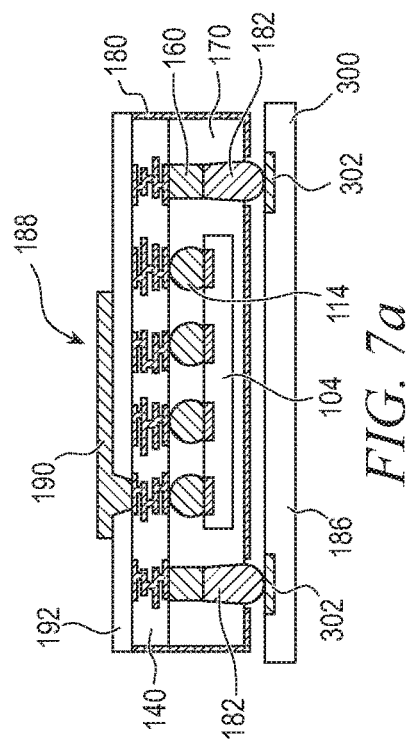
FIGS. 7a and 7b illustrate one of the shielded MLP units incorporated into an electronic device.
Figure 7B:
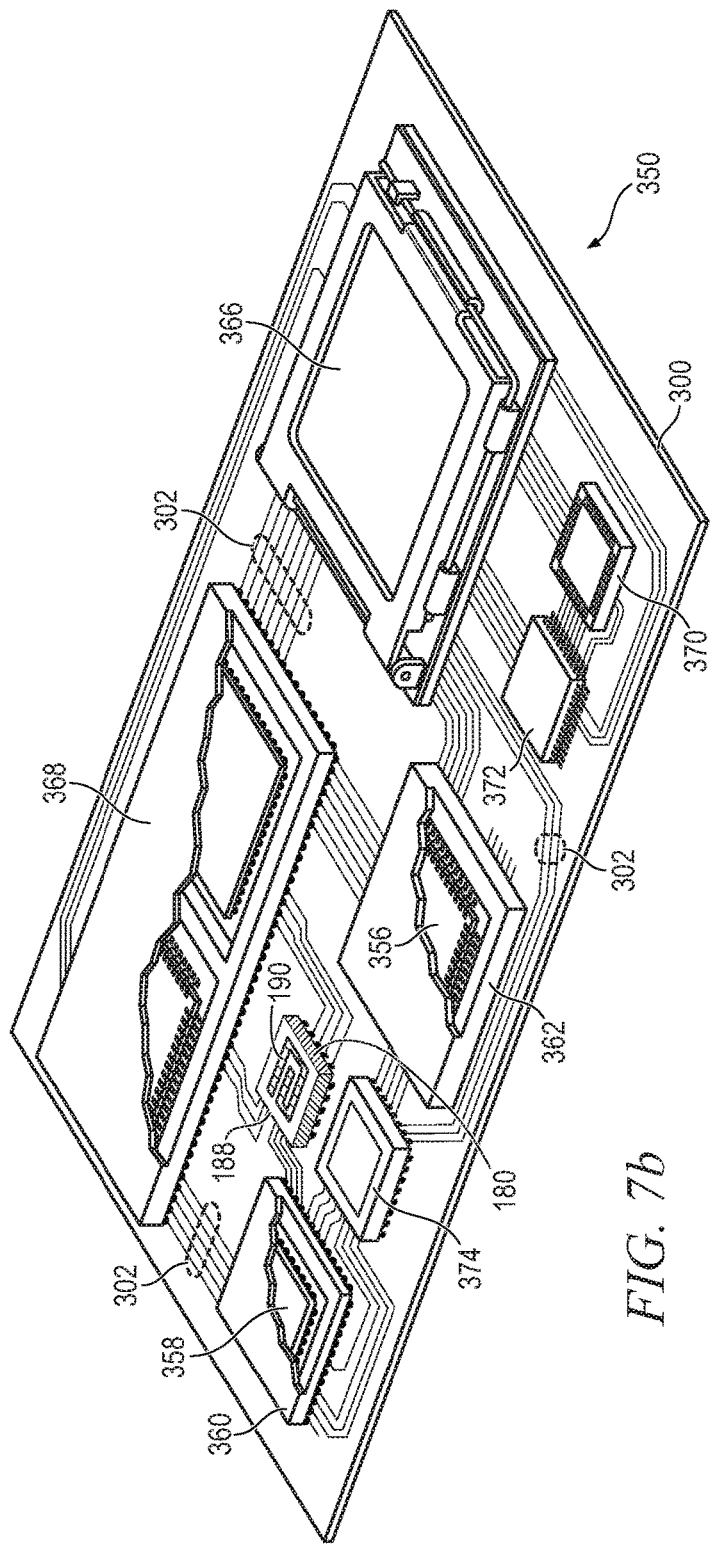

FIGS. 7a and 7b illustrate incorporating the above described MLP units, e.g., MLP unit 188, into an electronic device. FIG. 7a illustrates a partial cross-section of package 188 from FIGS. 3a and 3b mounted onto a PCB or other substrate 300 as part of an electronic device. Bumps 182 are reflowed onto conductive layer 302 of PCB 300 to physically attach and electrically connect MLP unit 188 to the PCB. In other embodiments, thermocompression or other suitable attachment and connection methods are used. In some embodiments, an adhesive or underfill layer is used between MLP unit 188 and PCB 300. Semiconductor die 104 is electrically coupled to conductive layer 302 through bumps 182, conductive pillars 160, conductive layers 156, and bumps 114.

FIG. 7b illustrates electronic device 350 including PCB 300 with a plurality of semiconductor packages mounted on a surface of the PCB, including MLP unit 188. Electronic device 350 can have one type of semiconductor package, or multiple types of semiconductor packages, depending on the application.

Electronic device 350 can be a stand-alone system that uses the semiconductor packages to perform one or more electrical functions. Alternatively, electronic device 350 can be a subcomponent of a larger system. For example, electronic device 350 can be part of a tablet computer, cellular phone, digital camera, communication system, or other electronic device. Electronic device 350 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 300 provides a general substrate for structural support and electrical interconnection of the semiconductor packages mounted on the PCB. Conductive signal traces 302 are formed over a surface or within layers of PCB 300 using evaporation, electrolytic plating, electroless plating, screen printing, or other suitable metal deposition process. Signal traces 302 provide for electrical communication between the semiconductor packages, mounted components, and other external systems or components. Traces 302 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 300. In other embodiments, a semiconductor device may only have the first level packaging where the die is mechanically and electrically mounted directly to PCB 300.

For the purpose of illustration, several types of first level packaging, including bond wire package 356 and flipchip 358, are shown on PCB 300. Additionally, several types of second level packaging, including ball grid array (BGA) 360, bump chip carrier (BCC) 362, land grid array (LGA) 366, multi-chip module (MCM) 368, quad flat non-leaded package (QFN) 370, quad flat package 372, and embedded wafer level ball grid array (eWLB) 374 are shown mounted on PCB 300 along with MLP unit 188. Conductive traces 302 electrically couple the various packages and components disposed on PCB 300 to MLP unit 188, giving use of the components within MLP unit 188 to other components on the PCB.

Depending upon the system requirements, any combination of semiconductor packages, configured with any combination of first and second level packaging styles, as well as other electronic components, can be connected to PCB 300. In some embodiments, electronic device 350 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate comprising a carrier and an interposer disposed on the carrier;
   disposing an electrical component over a first surface of the interposer;
   disposing an interconnect structure over the first surface of the interposer;
   depositing an encapsulant over the electrical component, interconnect structure, and substrate;
   forming a trench through the encapsulant and interposer into the carrier;
   forming a shielding layer over the encapsulant and into the trench;
   forming an opening through the shielding layer over the interconnect structure;
   depositing a solder material in the opening and on the interconnect structure; and
   removing the carrier after forming the shielding layer.

2. The method of claim 1, further including forming an antenna over the interposer opposite the electrical component.

3. The method of claim 1, wherein the shielding layer physically contacts the interconnect structure prior to the forming the opening through the shielding layer step.

4. The method of claim 1, further including disposing a semiconductor package over the interposer opposite the electrical component.

5. The method of claim 1, further including mounting the interposer to a printed circuit board with the solder material physically contacting the printed circuit board, wherein the electrical component is electrically connected to the printed circuit board through the substrate, interconnect structure, and solder material.

6. A method of making a semiconductor device, comprising:
   providing an interposer;
   disposing a first electrical component over a first surface of the interposer;
   depositing a first encapsulant over the first electrical component;
   forming a trench through the first encapsulant;
   forming a first shielding layer over the first encapsulant and into the trench;
   forming an opening in the first shielding layer;
   disposing an interconnect structure in the opening; and
   mounting the interposer to a substrate with the first electrical component electrically connected to the substrate through the interconnect structure.

7. The method of claim 6, further including disposing the interposer on a carrier, wherein the forming the trench step and the forming the first shielding layer step occur while the interposer remains on the carrier.

8. The method of claim 6, further including disposing an antenna over the interposer opposite the first electrical component.

9. The method of claim 6, further including forming a vertical interconnect structure on the interposer, wherein the depositing the first encapsulant step includes depositing the encapsulant over the vertical interconnect structure.

10. The method of claim 6, further including disposing a semiconductor package over the interposer opposite the first electrical component.

11. The method of claim 6, further including:
    disposing a second electrical component on a second surface of the interposer opposite the first surface; and
    depositing a second encapsulant over the second electrical component, wherein the forming the trench step includes forming the trench through the second encapsulant.

12. The method of claim 11, further including forming a second shielding layer over the second encapsulant, wherein the forming the trench step includes forming the trench through the second shielding layer.

13. The method of claim 6, further including disposing the interposer over the substrate with the first encapsulant and the first shielding layer disposed between the interposer and substrate.

14. A method of making a semiconductor device, comprising:
    providing an interposer;
    disposing a first electrical component over the interposer;
    depositing a first encapsulant over the first electrical component;
    forming a first shielding layer over the first encapsulant; and
    disposing the interposer over a substrate with the first shielding layer between the interposer and the substrate.

15. The method of claim 14, further including disposing a second electrical component over the interposer opposite the first electrical component.

16. The method of claim 15, further including depositing a second encapsulant over the second electrical component.

17. The method of claim 16, further including forming a second shielding layer over the second encapsulant.

18. The method of claim 17, further including forming a trench through the first encapsulant, the second encapsulant, and the second shielding layer.

19. The method of claim 18, wherein the forming the first shielding layer step includes forming the first shielding layer into the trench and contacting the second shielding layer.

20. A semiconductor device, comprising:
    an interposer;
    an electrical component disposed on the interposer;
    an encapsulant deposited over the electrical component;
    a shielding layer formed over the encapsulant including an opening formed in the shielding layer; and
    a solder bump disposed in the opening.

21. The semiconductor device of claim 20, wherein the interposer is disposed on a carrier.

22. The semiconductor device of claim 21, further including a trench formed through the encapsulant into the carrier, wherein the shielding layer is formed into the trench.

23. The semiconductor device of claim 20, wherein the shielding layer contacts the interposer.

24. The semiconductor device of claim 20, further including an antenna formed over the interposer opposite the electrical component.

25. The semiconductor device of claim 20, further including a vertical interconnect structure disposed on the interposer under the opening.

* * * * *